United States Patent
Fitzgerald et al.

(10) Patent No.: US 7,115,342 B2
(45) Date of Patent: Oct. 3, 2006

(54) PREPARATION OF PHOTOMASKS

(75) Inventors: Alexander Grant Fitzgerald, Dundee (GB); Katrin Jones, Aberdeenshire (GB)

(73) Assignee: University Court of the University of Dundee, (GB)

( * ) Notice: Subject to any disclaimer, the term of this patent is extended or adjusted under 35 U.S.C. 154(b) by 286 days.

(21) Appl. No.: 10/474,604

(22) PCT Filed: Apr. 11, 2002

(86) PCT No.: PCT/GB02/01722
§ 371 (c)(1),
(2), (4) Date: Dec. 9, 2003

(87) PCT Pub. No.: WO02/084400

PCT Pub. Date: Oct. 24, 2002

(65) Prior Publication Data

US 2004/0115538 A1    Jun. 17, 2004

(30) Foreign Application Priority Data

Apr. 12, 2001 (GB) .................................. 0109244.4

(51) Int. Cl.
*G01F 9/00* (2006.01)
*G21K 5/00* (2006.01)
*G03C 5/00* (2006.01)

(52) U.S. Cl. ............................. 430/5; 430/296; 378/35
(58) Field of Classification Search .................... 430/5, 430/296; 716/19–21; 378/35
See application file for complete search history.

(56) References Cited

U.S. PATENT DOCUMENTS 6,033,766 A * 3/2000 Block et al. ................. 428/210

FOREIGN PATENT DOCUMENTS

| JP | 53029073 | 3/1978 |
| JP | 01283830 | 11/1989 |

OTHER PUBLICATIONS

Willson, C.G., "Contrast Medium for X-Ray Mask Fabrication" *IBM Technical Disclosure Bulletin* 22(7):2871 (Dec. 1979).

* cited by examiner

*Primary Examiner*—S. Rosasco
(74) *Attorney, Agent, or Firm*—Myers Bigel Sibley & Sajovec, PA

(57) ABSTRACT

The present invention relates to the preparation of an x-ray photomask by exposing a free-standing film of a radiation sensitive metal/chalcogenide to an electron beam scanned in a defined pattern so as to generate areas in the film of reduced metal content in accordance with the defined pattern, as well as novel x-ray photomasks.

9 Claims, 1 Drawing Sheet

PREPARATION OF PHOTOMASKS

RELATED APPLICATIONS

Figure 1:
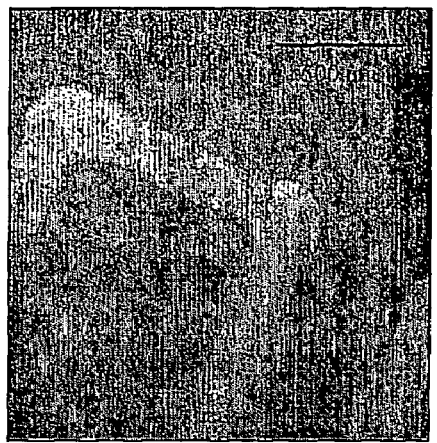

This application claims priority under 35 U.S.C. § 371 from PCT Application No. PCT/GB02/01722, filed in English on Apr. 11, 2002, which claims the benefit of Great Britain Application Ser. No. 0109244.4 filed on Apr. 12, 2001, the disclosures and contents of which are incorporated by reference herein in their entireties.

The present invention relates to the preparation of an x-ray photomask for use in the manufacture of, for example, silicon chips. The invention also relates to novel x-ray photomasks.

To produce microchips of high density, smaller components and smaller interconnects between the components are required. Integrated circuits are currently etched onto silicon chips using a photolithographic process. This process involves covering the microchip with a suitable resist, exposing the resist through a patterned mask to UV light, and finally removing the unexposed areas by etching in a suitable solvent. The wavelength of UV sources has now become a limiting factor for the dimensions of integrated circuits [i], as well as the dimensions of photomask architecture.

Sulphur, selenium and tellurium are elements of group VI of the periodic table and are collectively known as the chalcogen elements. The name chalcogen stems from the Greek word khalkos (χαλκός) for copper and refers to the occurrence of these elements in copper ores [ii]. Compounds that contain one or more of the chalcogen elements are called chalcogenides. In amorphous form the chalcogenides possess a variety of distinctive properties that lend these materials for manifold applications in the production of electronic devices. Currently, they find their main application as high-resolution resists in photo and electron beam lithography.

Amorphous chalcogenides exhibit a number of interesting photoinduced effects. These range from minor structural rearrangements, which result in changes in the optical bandgap energy, to more complex atomic and molecular modifications, such as photocrystallisation or photodissolution of metals [iii].

One of the most interesting properties of the amorphous chalcogenides is the tendency of certain metals to dissolve in these materials under illumination with light. This effect is known as photodissolution or photodoping and can be observed in chalcogenide-metal layer structures. The result is a basis for many applications of the chalcogenides, for example as inorganic resists in photo and electron beam lithography.

An interesting phenomenon has been observed when photodoped chalcogenides are illuminated through a mask with visible or UV light [iv]. The metal content increases in the illuminated region and decreases in the covered region. This effect was first reported by Tanaka et al. and has become known as photoinduced chemical modification (PCM). Tanaka et al. and Yoshida et al. [v,vi] studied the effect mainly in Ag—As—S glasses.

When a thin film of amorphous Ag—As—S is partially covered and illuminated with light, silver migrates from the covered region towards the illuminated region. The process can be reversed by covering the previously illuminated area and illuminating the sample again. The silver migrates towards the illuminated area and a reversed Ag profile is obtained. When the cover is removed and the whole sample is illuminated, the silver redistributes homogeneously throughout the sample Electron beam irradiation of Ag-photodoped chalcogenides has been shown to cause a migration of silver towards the irradiated area, [vii–viii]. Although this electron induced chemical modification (ECM) appears to be similar to the PCM, there are some significant differences. The metal, once accumulated in the irradiated region does not redistribute under repeated irradiation and the effect seems to be much more efficient when induced by an electron beam. An increase in silver content of up to 20 at. % in the irradiated region has been observed [vi].

Yoshida et al. [vi] reported a dependence of ECM on the accelerating voltage. The greatest compositional changes are observed at an accelerating voltage of 10 kV. Further increasing of the accelerating voltage results in a decreased magnitude of ECM. At accelerating voltages higher than 50 kV no ECM generated increase of Ag or only a very small increase is observed in the irradiated region.

The ECM is generally accompanied by a volume expansion of the irradiated region. Features of 5 μm height and diameter have been produced by Yoshida et al. [ix].

It should be noted that under certain experimental conditions a focused electron beam causes silver to diffuse away from the irradiated region. This effect has been observed by McHardy et al. [x] in free standing chalcogenide-silver films. Silver free lines of 15 nm width have been produced using a high resolution scanning transmission electron microscope.

The present invention is based in part on the phenomenon that metal diffuses away from an irradiated region in free standing silver doped chalcogenide films and as identified by the present inventors how this may be employed in making x-ray photomasks.

In a first aspect the present invention provides a method of preparing an x-ray photomask for use in the production of semiconductor devices, the method comprising the steps of:
  a) providing a free-standing film of a radiation sensitive metal/chalcogenide; and
  b) exposing the film to an electron beam scanned in a defined pattern in order that metal in the metal/chalcogenide diffuses away on exposure to the electron beam so as to generate areas in the film of reduced metal content in accordance with the defined pattern.

The method may further comprise the step of
  c) removing the chalcogenide in the electron-beam exposed area to leave a film comprising metal/chalogenide in the unexposed areas and metal of reduced content or substantially metal free content in the exposed areas.

The metal/chalcogenide film is "free-standing" in the sense that films are not supported on a bulk substrate. Rather, the films may be supported on for example grids or membranes, such as silicon nitride membranes, of thicknesses between for example 50 nm–150 nm, typically 100 nm. The metal/chalcogenide film is typically an amorphous chalcogenide film in contact with a metal such as silver, copper, platinum, palladium or the like. Any metal which is able to react with the chalcogenide such as by illumination and diffuse away on exposure to a suitable radiation beam may be used. Suitable chalcogenides include $As_2S_3$, $As_2Se_3$, GeS, GeSe, and $GeSe_2$, and other non-stoichiometric chalcogenides of arsenic, germanium, bismuth and antimony.

It is possible to first provide a layer of chalcogenide and coat this with a layer of metal. Subsequently reaction of the metal, for example by illumination, results in the metal reacting with the chalcogenide and the two layers becoming less distinct. Alternatively the metal may be coated as a layer first, followed by the chalcogenide. Typically the layers are prepared by vacuum evaporation. However, the metal can also be absorbed into the chalcogenide film as ions from a solution. The film then behaves in a similar way in an electron beam as metal/chalcogenide bilayers formed by vacuum deposition. Generally speaking the metal concentration in the metal/chalcogenide film may be greater than 30 wt. %, preferably greater than 50 wt. % such as 70 wt. %.

The film is exposed to an electron beam scanned in a defined pattern. The electron beam of suitable energy (ie. 15 keV to 100 KeV), may be focused to produce a fine point of radiation capable of drawing lines for example using an e-beam writer on the metal/chalcogenide of less than 10 μm, 5 μm, 1 μm, 100 nm and even down to less than 50 nm, 10 nm or 5 nm thickness.

The metal in the metal/chalcogenide diffuses away on exposure to the radiation beam to leave an exposed area which comprises metal of reduced metal content or preferably substantially metal free.

By using for example an e-beam writer focussed to a fine beam it is possible to draw extremely complex patterns of reduced metal content or substantially metal free (ie. by exposure to the beam) in the metal/chalcogenide film. Areas with significant amounts of metal content (eg. A bilayer containing a 500 nm thick film of silver) absorb x-rays, whereas areas that have reduced metal content or are substantially free of metal transmit x-rays.

Depending on the thickness and/or x-ray transmissibility of the chalcogenide, the chalcogenide may be removed to leave a film comprised of metal/chalcogenide in unexposed areas) and areas of reduced metal content or substantially metal free in exposed areas. The chalcogenide may be removed for example using an alkaline solution such as a 0.3N NaOH solution. The film may thereafter be supported by an x-ray transmissive substrate, such as silicon nitride or carbon.

The present invention also relates to a photomask manufactured by a method as described herein.

In a further aspect the present invention provides a photomask comprising an x-ray transmissive substrate supporting a metal film comprising areas of metal which areas are x-ray non-transmissive and areas of reduced metal content, or substantially metal-free which areas are x-ray transmissive.

There is also provided use of a photomask as described herein in the manufacture of an electronic device, especially a semiconductor device.

According to a yet further aspect of the invention there is provided use of a radiation sensitive metal doped chalcogenide in the preparation of a photomask.

Figure 2:
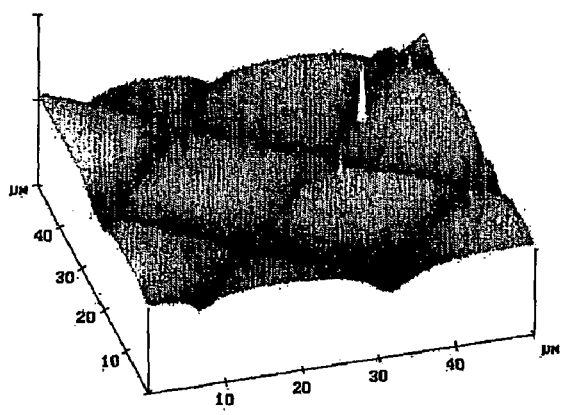
Figure 3:
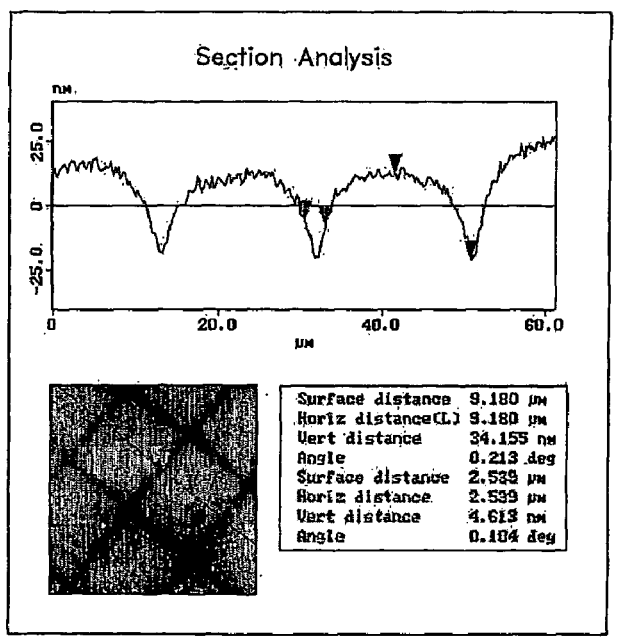

The present invention will now be further described by way of example and with reference to the figures which show:

FIG. 1 shows a TEM image from a pattern in an $As_2S_3$/Ag film of 33 nm thickness and 51 wt. % Ag, produced by an electron beam of 100 kV in a JEM 200CX;

FIG. 2 shows an AFM image from a pattern in an $As_2Se_3$/Cu film with 38 wt. % Cu, produced in an electron beam writer at 15 kV accelerating voltage and 1 nA beam current; and FIG. 3 shows a section analysis of a pattern on $As_2Se_3$/Cu film with 38% Cu.

Sample Preparation

All materials were deposited by physical vapour deposition (PVD) to produce samples in thin film form that could be analysed by transmission electron microscopy. Silicon nitride membranes in the form of TEM compatible frames, and frames for x-ray masks were supplied by Fastec Ltd. These frames contained thin film windows with membranes of 100 nm thickness.

Evaporation of Chalcogenides and Metals

Bi-layers of a chalcogenide and a metal were prepared by physical vapour deposition (PVD). Two kinds of sample were produced, referred to as chalcogenide/metal layers and metal/chalcogenide layers in reference to the order of evaporation.

It should be noted that silver and copper diffuse into and even through the chalcogenide layer, as demonstrated by Fitzgerald et al. [x, xi]. These metal and chalcogenide layer therefore become less distinct immediately after preparation.

The metals were evaporated from resistance heated tungsten boats. Tungsten pepperpot boats were required for the evaporation of the chalcogenides to prevent these materials from "jumping" out of the boat upon heating. All materials used are given in Table 1 with their respective purity, form and evaporation rate. The evaporation rate must be carefully controlled as it was found that at high evaporation rates, the films exhibited inaccurate stoichiometry and tended to peel off the substrates.

TABLE 1

Properties of the evaporated materials

| Material | Chemical purity (%) | Form Evaporation | rate (nm/min) |
|---|---|---|---|
| $As_2Se_3$ | 99.999 | fused pieces | 26.8 |
| $As_2S_3$ | 99.999 | down fused lump | 37.1 |
| Ag | 99.99 | wire, 0.25 mm Ø | 12 |
| Cu | 99.99 | foil, 0.127 mm | 14.3 |
| Au | 99.99 | wire, 0.2 mm Ø | 6.6 |
| In | 99.9 | shot, 4 mm Ø | 17.4 |

The film thickness was monitored in situ using a quartz crystal. This crystal is excited into thickness shear mode vibrations of 6 MHz by an external oscillator. The actual frequency of the crystal's oscillation depends on the mass deposited on its surface and decreases as the deposit builds up. This change in frequency is proportional to the mass of the deposited material and can consequently be used to calculate the film thickness [xii].

The majority of samples consisted of a metal film of 5 nm to 16 nm thickness and a chalcogenide film of 23 nm to 100 nm thickness. This corresponds to metal proportions ranging from 8 wt. % to 48 wt. %, while the overall mass of the films remained constant. However, films with a metal content of up to 70 wt % were studied.

Patterning of Films

The majority of the films were patterned using an electron beam writer, which allowed setting and monitoring of all exposure parameters, such as acceleration voltage, beam current and exposure time. The electron beam writer consists of a commercial scanning electron microscope (JOEL JSM-T220) that can be computer controlled using the software ELPHY Quantum, Universal SEM based Nano Lithography System, Version 1.232.

The microscope can be operated at accelerating voltages between 5 and 30 kV in 5 kV increments. No line growth could be observed at an accelerating voltage of 5 kV; and at 30 kV the patterns appeared blurry in the SEM image for most samples.

To study the influence of the exposure conditions on the growth characteristics, lines of about 50 μm length were drawn using the line scan mode. The accelerating voltage was increased from 10 to 25 kV in 5 kV increments, while the exposure time was varied between 2 min and 15 min per line at each of the acceleration voltage settings. The beam current for this experiment was set at 1 nA, which was the highest beam current attainable at the lowest accelerating voltage. The sets of lines were written onto thin films of $As_2Se_3/Ag$, $Ag/As_2Se_3$, $As_2Se_3/Cu$ and $Cu/As_2Se_3$. At least four samples of each kind were prepared and studied.

To establish whether $As_2Se(S)_3/In$ and $As_2Se(S)_3/Au$ films can be patterned by an electron bear, a number of samples with varying metal content were exposed to an electron beam using the line scan mode at 15 kV accelerating voltage and 1 nA beam current, which had produced good results in the preceding experiments.

A number of films supported on thin film membranes were patterned in a conventional transmission electron microscope, which provided higher accelerating voltages. The accelerating voltage was set at 100 kV. The electron beam was focused to a spot size of 1.4 µm and manually scanned across the sample by moving the specimen shifting knobs.

The size of the patterns was subsequently measured employing an atomic force microscope (AFM. It was shown that at low acceleration voltages (10 kV to 20 kV), with films deposited on substrates, most of the electron-hole pairs are excited within the first few 100 nm, which corresponds to the thickness of the films.

Transmission Electron Microscopy

Transmission electron microscopy (TEM) is a powerful technique in the study of the microstructure of thin films. In this project a JEOL JEM-100C and a JEOL JEM-200CX instrument have been employed to study the microstructure of thin films of chalcogenides and metals. These microscopes provide accelerating voltages of up to 100 kV and 200 kV, respectively. The JEM-200CX is equipped with a Gresham energy-dispersive x-ray spectrometer (EDS), which allowed compositional analysis of the materials.

Both instruments can be operated in imaging mode or in diffraction mode.

A Nanoscope, Dimension 3000 scanning probe microscope (SPM) from Digital Instruments was used to obtain three-dimensional images of patterns on chalcogenide-metal films.

Atomic force microscopy (AFM is a very powerful tool to image surface topography on a nanometre scale. It facilitates the measurement of surface features in all three dimensions, with a z resolution of better than 1 Å.

A very sharp tip (of the order of a few nanometres radius of curvature at the end) is scanned across the surface of the sample thus probing and mapping the morphology of the surface [xiii]. The tip is mounted on the end of a long cantilever that has a spring constant less than the interatomic bond strength.

For investigations the instrument was operated in tapping mode to avoid damage to the surface. This was especially important when patterns on thin film membranes were measured. In this mode of operation the cantilever is oscillated at a frequency close to its resonance frequency (about a few hundred kHz) while retracted from the surface. The tip is then brought towards the sample until it touches the surface. The van der Waals forces between tip and surface atoms cause a decrease in the oscillation amplitude. The new amplitude is retained constant by means of a feedback control loop while the tip is scanned across the surface by a piezoelectric scanner that can be moved in sub-angstrom increments. The scanner adjusts the tip height to maintain a constant height over the surface. These height adjustments are monitored using a beam deflection system. A laser beam is focused onto the back of the cantilever and is reflected from there onto a segmented photodiode. Minute deflections of the cantilever cause one segment of the photodetector to collect more light than another. The amplified signal is proportional to the deflection of the cantilever and is used to image the forces across the sample.

Amorphous chalcogenide thin films in contact with silver, copper, gold or indium films were studied. The materials were prepared by vacuum evaporation and were subsequently investigated using electron diffraction and x-ray microanalysis (EDS) in the transmission electron microscope (TEM). The aim was to confirm the stoichiometric composition of the films, to determine the level of reaction with the chalcogenides and to ascertain which reaction products could be formed. The results of this study provide the basis for investigations of the patterns that can be produced in these materials by electron beam irradiation.

EXAMPLE 1

Amorphous Chalcogenides and Silver

The contact reaction of $As_2Se_3$ and $As_2S_3$ with Ag was studied by electron diffraction in the TEM.

Bi-layers of chalcogenide and silver with silver contents between 8 wt. % and 70 wt. % were prepared and analysed. It was found that silver films dissolve spontaneously into chalcogenide films. No additional illumination with light was necessary to induce this reaction. It was also not important whether the metal was evaporated underneath or on top of the chalcogenide.

Samples with high silver concentrations (>50%) were very sensitive to electron irradiation and it was found that the silver diffused away from the irradiated areas. This could be observed in the following way: the microscope was operated in the diffraction mode and the sample was moved to an unexposed area. A diffraction pattern was observed (data not shown). Within a few seconds these patterns changed and the diffraction pattern from a pure chalcogenide was observed.

It should be noted here that to avoid silver diffusion while taking diffraction patterns, the intensity of the electron beam had to be reduced to a very low level. The microscope was set up at normal intensity, then the intensity was reduced drastically and the sample moved to a fresh area. From this new area the diffraction pattern was recorded.

EXAMPLE 2

Amorphous Chalcogenides and Copper

Bi-layers of amorphous chalcogenides and copper with copper concentrations between 8 and 48 wt. % were prepared and analysed using electron diffraction in the TEM.

Similar to silver, copper was found to react readily with amorphous chalcogenides. Films containing copper in high concentrations are sensitive to electron beam irradiation. Copper diffused away from the irradiated area under prolonged irradiation at normal intensity. The effect was not as strong as in chalcogenide-silver films, but the same procedure as described above for obtaining diffraction patterns was employed. In the case of chalcogenide-silver and chalcogenide-copper films that contained high proportions of silver or copper, a diffusion of these metals away from the irradiated area was observed upon irradiation with an electron beam of high intensity. This effect was not observed in the investigated chalcogenide/indium films.

EXAMPLE 3

Formation of Lines by Electron Beam Irradiation

A focused electron beam was scanned across the surface of a free-standing chalcogenide-silver film in the TEM. The silver diffused away from the irradiated area. The effect occurred only in samples with a silver content of more than ≈ 40 wt. % for $As_2Se_3/Ag$ films and more than ≈45 wt. % for $As_2S_3/Ag$ films. When operating the microscope in the diffraction mode this diffusion effect could be clearly observed: the sample was moved to a fresh area and initially the diffraction pattern of the reaction product was visible on the screen. In a few seconds this diffraction pattern changed and was replaced by the diffraction pattern of the pure chalcogenide. FIG. 1 shows a TEM image of a pattern generated in the film by manually moving the sample using the specimen shifting knobs while irradiating the sample with a focused electron beam of 100 kV accelerating voltage.

A diffraction pattern, taken from the irradiated area, confirmed that the silver had diffused away from the irradiated area. Only the diffraction pattern of amorphous $As_2S_3$, with a very sharp first diffraction ring, was detected.

Similar to silver, a copper diffusion in $As_2Se(S)_3/Cu$ films was induced by a high intensity electron beam. The effect occurred in $As_2Se_3/Cu$ films containing more than ≈30 wt. % Cu, and in $As_2S_3/Cu$ films containing more than ≈35 wt. % Cu.

Chalcogenide-gold and chalcogenide/indium films containing high levels of gold and indium did not exhibit the diffusion effect. The diffraction patterns did not alter, even under prolonged exposure with a high-intensity electron beam.

EXAMPLE 4

Investigation of Line Patterns

Chalcogenide-silver and chalcogenide-copper films with sufficiently high metal concentrations were exposed to a focused electron beam in an SEM. The accelerating voltages applied were 10 to 30 kV. Utilising the line scan mode, the electron beam was scanned across the films and line patterns formed. These lines were analysed in the TEM, and the diffraction patterns indicated that the silver and copper had diffused away from the irradiated areas. This signified that the effect also occurs at much lower accelerating voltages than usually applied in the TEM.

To determine whether the lines formed in the SEM produced protruding patterns in the films, some of the samples were investigated using an atomic force microscope (AFM. To provide a better stability for AFM measurements, chalcogenide-silver and chalcogenide-copper films of sufficiently high metal concentrations were deposited onto silicon nitride membranes of 100 nm thickness. They were then patterned using an electron beam writer, operated at 15 kV accelerating voltage and 1 nA beam current. An example of a pattern produced in this way is displayed in FIG. 2. The three-dimensional image shows that troughs had formed in the film. From the section analysis of the pattern, presented in FIG. 3, the depth of the troughs was measured and found to be about 34 nm and the width was found to be about 2.5 µm.

In films of very high silver or copper concentration a high-intensity electron beam causes the metal to diffuse away from the irradiated area. By scanning a focused electron beam across these films, troughs were formed, which did not contain silver or copper.

One of the important features of the diffusion effect is that it is limited to the irradiated area Hence, the size of the pattern is related to the spot size of the electron beam. Using a medium spot size in the transmission electron microscope JEM 200CX silver-free troughs of a width of about 200 nm were produced on an $As_2S_3/Ag$ sample with 51 wt. % Ag. The spot sizes used in the electron beam writer were usually much larger to provide the required beam intensity. Hence the obtained pattern sizes were considerably larger in these samples. However, by using a high-resolution transmission electron microscope, a much smaller trough width can be achieved, as has been shown for GeS/Ag and $GeSe_2/Ag$ films by McHardy et al. These researchers produced silver-free troughs of 15 nm width.

The diffusion effect allows the production of a new generation of x-ray masks with attainable pattern sizes of approximately 15 nm or less depending on the ability to focus the writing beam.

Currently x-ray masks are fabricated in a multistep process. Latest developments in producing x-ray masks, in which metal lines are produced by decomposition of organometallic films upon electron beam exposure [xiv], reduce the number of steps involved but still require the dissolution of the remaining organometallic film after the exposure. Furthermore, the obtained pattern will be metallic, hence absorbing x-rays in the patterned areas, whereas the use of chalcogenide-metal systems result in metal free patterns and therefore transmit the x-rays in the patterned areas.

From theoretical data [xv] it was determined that an $As_2Se_3/Ag$ film consisting of a 480 nm thick $As_2Se_3$ and a 500 nm thick silver film, which corresponds to 70 wt. % silver, exhibits a good contrast in the x-ray transmission curves at 1 keV, an energy that is commonly used in x-ray lithography.

EXAMPLE 5

Influence of Development of X-ray Masks in Alkaline Solutions

The photodoping effect, which has been observed in chalcogenide/silver films, occurs in a spectral range of about 300 to 500 nm. X-rays would therefore not be able to induce the photodoping effect, which in theory could reverse the patterning of the masks.

The investigated samples were successfully developed in an alkaline solution (0.3N NaOH solution). This removed the chalcogenide film from the areas that had been patterned and did not contain silver any more. It was found that a development time of around 10 to 20 s was enough to remove the chalcogenide films from the areas that were free of silver after the patterning. These patterns were then stable and the silver could not diffuse back into these areas.

From these results it can be concluded, that a development procedure can be employed to remove the chalcogenide layer in the patterned areas. This can increase x-ray transmission when thicker chalcogenide films are used for the masks.

CONCLUSION

The silver diffusion effect in chalcogenide/silver thin films can be exploited for the fabrication of x-ray masks. Providing suitable film thickness and silver concentration are used, the patterns produced by a scanning electron beam are free of silver and transmit x-rays of certain energy. The areas that were not exposed to electron beam irradiation contain a sufficient amount of silver to absorb all incoming x-rays of that energy. For x-rays of 1 keV energy for example, the silver layer should be at least 500 nm thick to prevent transmission of these x-rays.

The thickness of the chalcogenide layer should be chosen so that a silver concentration of at least 30 wt. % is obtained. This is the lower limit at which the diffusion effect is noticeable. However, a silver concentration between 50 wt. % and 70 wt. % is preferred. The sensitivity to electron beam irradiation is very high in samples with these silver concentrations and mask writing efficiency can be improved.

To allow transmission of x-rays whilst absorbing x-rays in the areas unexposed to electrons the original sample should be produced as follows. The chalcogenide layer should not be too thick. Generally a layer thickness of 480 nm is recommended to allow transmission of x-rays in the patterned areas. A silver film thickness of 500 nm which corresponds to 70 wt. % silver in the chalcogenide may be deposited, for example, to guarantee absorption of x-rays in the non-exposed areas.

If lower silver concentrations were used, the chalcogenide layer would have to be thicker and therefore would become less transparent to 1 keV x-rays. In this case, a development procedure of the x-ray masks after fabrication could be applied. This would remove the silver-free chalcogenide from the patterns and therefore increase the transmission in these areas.

REFERENCES

[i] R. F. Pierret, Semiconductor Device Fundamentals, Addison-Wesley Publishing Company, 1996.
[ii] J. C. Kotz, P. Treichel, Jr., Chemistry & Chemical Reactivity, 3rd edition, Saunders College Publishing, 1996
[iii] A. E. Owen, A. P. Firth, P. J. S. Ewen, Philosophical Magazine B, Vol. 52 (1985), No. 3, p. 347
[iv] K. Tanaka, N. Yoshida, Y. Yamaoka, Philosophical Magazine Letters, Vol. 68 (1993), No. 2, p. 81
[v] N. Yoshida, K. Tanaka, Journal of Applied Physics, Vol. 78 (1995), No. 3, p. 1745
[vi] N. Yoshida, K. Tanaka, Journal of Non-crystalline Solids, 210 (1997), p.119
[vii] N. Yoshida, M. Itoh, K. Tanaka, Journal of Non-Crystalline Solids, Vol. 198–200 (1996), p. 749
[viii] T. Kawaguchi, S. Maruno, K. Masui, Journal of Non-Crystalline Solids, Vol. 77&78 (1985), p. 1141
[ix] N. Yoshida, K. Tanaka, Applied Physics Letters, Vol. 70 (1997), No. 6, p. 779
[x] C. P. McHardy, A. G. Fitzgerald, P. A. Moir, M. Flynn, J. Phys. C: Solid States Phys., Vol. 20 (1987), p. 4055
[xi] A. G. Fitzgerald, C. P. McHardy, Surface Science, Vol. 162 (1985), p. 568
[xii] Intellemetrics, Deposition controller instruction manual, 1987
[xiii] D. Sarid, Scanning Force Microscopy, Oxford University Press, New York and Oxford, 1991
[xiv] G. J. Berry, J. A Cairns, M. R. Davidson, D. R. G. Rodley, J. Thomson, I. C. E. Turcu, W. Shaikh Review of Scientific Instruments, Vol. 69 (1998), No. 9, p. 3350
[xv] Web page of the Center for X-ray Optics, E.O. Lawrence Berkeley National Laboratory, URL: http://www-cxro.lbl.gov/

The invention claimed is:

1. A method of preparing an x-ray photomask for use in the production of semi-conductor devices, the method comprising the steps of:
   a) providing a free-standing film of a radiation sensitive metal/chalcogenide; and
   b) exposing the film to an electron beam scanned in a defined pattern, in order that metal in the metal/chalcogenide diffuses away on exposure to the electron beam so as to generate areas in the film of reduced metal content in accordance with the defined pattern.

2. The method according to claim 1, wherein the metal is silver, copper, platinum, palladium or any other metal which is able to react with the chalcogenide and diffuse away on exposure to a suitable radiation beam.

3. The method according to claim 1, wherein the chalcogenide is selected from $As_2S_3$, $As_2Se_3$, GeS, GeSe, $GeSe_2$ and other non-stoichiometric chalcogenides of arsenic, germanium, bismuth and antimony.

4. The method according to claim 1, wherein the metal/chalcogenide film is greater than 30 wt%.

5. The method according to claim 1, wherein features of less than 10 µm across are capable of being patterned.

6. A photomask prepared by the method according to claim 1.

7. A method of manufacturing an electronic device, the method comprising the steps of:
   (a) Providing the photomask according to claim 6; and
   (b) exposing a resist through said photomask.

8. A photomask comprising an x-ray transmissive substrate comprising a radiation sensitive metal doped chalcogenide, supporting a metal film comprising areas of metal which areas are x-ray non-transmissive and areas of reduced metal content, or substantially metal-free which areas are x-ray transmissive.

9. A method of manufacturing an electronic device, the method comprising the steps of:
   (a) Providing the photomask according to claim 8; and
   (b) exposing a resist through said photomask.

* * * * *